United States Patent [19]

De Luca

[11] Patent Number: 5,025,234

[45] Date of Patent: Jun. 18, 1991

[54] TRANSVERSAL FILTER WITH WIDE BAND PHASE SHIFTERS IN SERIES WITH THE DELAY CELLS

[75] Inventor: Olivier De Luca, Suresnes, France

[73] Assignee: Alcatel N.V., Amsterdam, Netherlands

[21] Appl. No.: 308,308

[22] Filed: Feb. 8, 1989

[30] Foreign Application Priority Data

Feb. 9, 1988 [FR] France .................................. 88 01504

[51] Int. Cl.$^5$ .......................... H03H 15/00; H04B 3/14
[52] U.S. Cl. ....................................... 333/166; 375/15
[58] Field of Search ..................... 333/166, 18; 375/14, 375/15; 379/411

[56] References Cited

U.S. PATENT DOCUMENTS

| | | | |
|---|---|---|---|
| 3,366,955 | 1/1968 | Mattern | 342/123 |
| 4,210,882 | 7/1980 | Roza et al. | 333/166 |
| 4,594,725 | 6/1986 | Desperben et al. | 375/14 X |
| 4,607,377 | 8/1986 | Atobe et al. | 333/18 X |

FOREIGN PATENT DOCUMENTS

| | | |
|---|---|---|
| 0209928 | 6/1986 | European Pat. Off. . |
| 276511 | 8/1988 | European Pat. Off. ............ 333/166 |
| 2402345 | 8/1978 | France . |

OTHER PUBLICATIONS

"Egaliseurs Auto-Adaptatifs en Bande de Base Pour Faisceaux Hertziens Numeriques (1)", Par. O. de Luca, Division Faisceaux Hertziens de Thompson-CSF, Revue Technology Thompson-CSF, vol. 16, N*1, Mar. 1984.

Archiv Fur Elektronik und Ubertragungstechnik, vol. 25, No. 3, Mar. 1971, pp. 155-159, Stuttgart, DE. P. Leuthold.

6 GHz 135MBPS Digital Radio System with 64 Qam Modulation, pp. F2.4.1-F2.4.6, T. Noguchi et al., Microwave & Satellite Comm. Div., C&C System Research Labs.

*Primary Examiner*—Benny T. Lee
*Attorney, Agent, or Firm*—Christie, Parker & Hale

[57] ABSTRACT

A transversal filter comprising: a series connection of M+L delay cells (12) defining M+L+1 signal samples; M+L+1 branches each having a midpoint connected to receive a respective one of said signal samples and first and second multipliers (10, 11) for multiplying its signal sample by respective first and second coefficients; and first and second summing circuits (13, 14) respectively connected to sum the outputs from said first multipliers (10) and from said second multipliers (11), wherein a wideband phase shifter (17) is associated in series with each delay cell (12), said phase shifter providing a phase shift $\delta\phi$ such that $\delta\phi = \Omega_0 T$ (modulo $2\pi$) where $\Omega_0$ is the angular frequency of the intermediate carrier and T represents the duration of the delay due to a delay cell (12).

7 Claims, 4 Drawing Sheets

TRANSVERSAL FILTER WITH WIDE BAND PHASE SHIFTERS IN SERIES WITH THE DELAY CELLS

The present invention relates to a transversal filter. The invention concerns optimizing the structure of a transversal filter operating at intermediate frequency and used in a time equalizer for digital microwave beams.

BACKGROUND OF THE INVENTION

High capacity digital microwave beam transmission requiring a large bandwidth per channel is particularly subject to selective fading due to multi-path propagation. The passband required for transmitting each channel can, however, be reduced by using high spectrum efficiency multi-state modulation, thereby optimizing utilization of predetermined frequency allocations. Unfortunately, the complexity of such forms of modulation makes them sensitive to distortion. Transmission degradation gives rise to the appearance of errors, thereby degrading the quality, and in severe cases the availability, of a link.

Various remedies may be proposed:
frequency diversity: i.e. switching from a disturbed channel to a redundant channel used as a spare. Unfortunately, frequency diversity is insufficient when several channels are disturbed simultaneously;

space diversity, which may be constituted by diversity at maximum power, by diversity at minimum distortion, or by diversity by baseband switching. Space diversity is effective (although limited to correcting trouble due to propagation), but it is costly in antennas and consequently in locations on microwave towers;

self-adaptive equalization in baseband, i.e. full processing of the signal (in amplitude and in phase), capable of providing correction beyond that required for selective fading due to multiple paths. Such equalization is described in an article entitled "Self-adaptive baseband equalizers for digital microwave beams" by O. de Luca in the Thomson-CSF Technical Journal, volume 16, No. 1, March 1984;

self-adaptive equalization at intermediate frequency. Unlike equalization in baseband, both of the paths in quadrature are processed simultaneously, thereby making it possible to obtain structures which are less complicated and thus cheaper in analog embodiments. An equalizer of this type based on the principle of the transversal filter, makes it possible to correct the distortions to which the signal is subject, and in particular those due to multiple paths.

The object of the invention is to optimize the structure of a transversal filter operating at intermediate frequency and used in a time equalizer.

SUMMARY OF THE INVENTION

To this end, the present invention provides a transversal filter comprising: a series connection of $M+L$ delay cells defining $M+L+1$ signal samples; $M+L+1$ branches each having a midpoint connected to receive a respective one of said signal samples and first and second multipliers for multiplying its signal sample by respective first and second coefficients; and first and second summing circuits respectively connected to sum the outputs from said first multipliers and from said second multipliers, wherein a wideband phase shifter is associated in series with each delay cell, said phase shifter providing a phase shift $\delta\phi$ such that $\delta\phi = \Omega_O T$ (modulo $2\pi$) where $\Omega_O$ is the angular frequency of the intermediate carrier and T represents the duration of the delay due to a delay cell which advantageously has the value $T = T_s$, where $T_s$ represents the duration of one symbol.

In a second embodiment, the invention proposes a filter in which each delay cell is connected to the midpoint of a branch of index i by a phase shifter providing a phase shift of value $i\delta\phi$, where $-M \leq i \leq +L$.

Advantageously, a filter is made such that $M = L = 2$, with $\Omega_O T_s = -\pi/2$ (modulo $2\pi$), and the branch of index $-2$ has a first coefficient $-C_{p-2}$ and a second coefficient $-C_{q-2}$; the branch of index $-1$ has a first coefficient $-C_{q-1}$ and a second coefficient $-C_{q-1}$; the branch of index $+1$ has a first coefficient $C_{p+1}$ and a second coefficient $-C_{p+1}$; and the branch of index $+2$ has a first coefficient $-C_{p+2}$ and a second coefficient $-C_{q+2}$.

BRIEF DESCRIPTION OF THE DRAWINGS

Embodiments of the invention are described by way of example with reference to the accompanying drawings, in which.

DETAILED DESCRIPTION OF THE INVENTION

A transversal filter modifies the signal by a weighted combination of said signal taken at different instants, at successive time intervals T.

Figure 1:
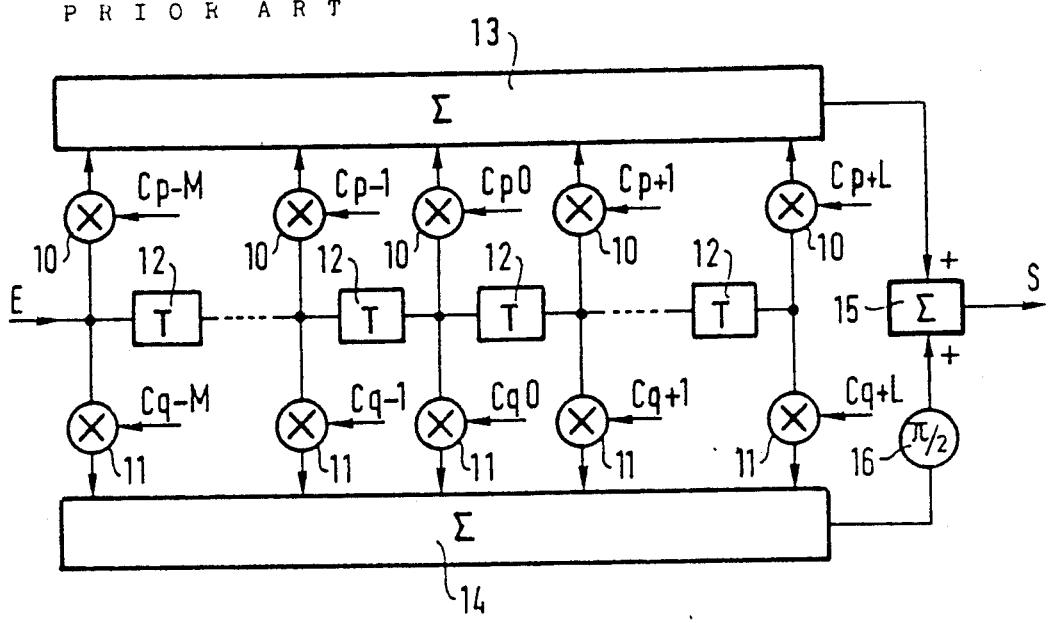
FIG. 1 shows the structure of a prior art transversal filter.

Such a filter, as shown in FIG. 1, has a central coefficient $C_O$, M complex leading coefficients (with indices $-M$ to $-1$) for correcting the front part of the impulse response, and L trailing coefficients (having indices from $+1$ to $+L$) for correcting the rear portion of the impulse response.

This prior art transversal filter comprises $M+L+1$ branches each having a respective index i, where $-M \leq i \leq +L$, i.e.:

a central branch of index 0;
L branches with positive indices $+1$ to $+L$; and
M branches with negative indices $-1$ to $-M$;
with each branch comprising, on either side of a midpoint, a first multiplier 10 for multiplying by a respective coefficient $C_{p_i}$ corresponding to the in-phase signal portion, and a second multiplier 11 for multiplying by a coefficient $C_{q_i}$ corresponding to the quadrature signal portion.

The filter also includes $M+L$ delay cells 12 connected in series with the first cell receiving the input signal E, and with each delay cell 12 being disposed between the midpoints of two adjacent branches.

The second ends of the first multipliers 10 are connected to respective inputs of a first summing circuit 13, and the second ends of the second multipliers 11 are connected to respective inputs of a second summing circuit 14, with the output from the first summing circuit being directly connected to a first input of a third summing circuit 15, and with the output from the second summing circuit being connected to a second input of said third summing circuit 15 via a $\pi/2$ phase shifter 16, such that the output from the third summing circuit constitutes the output S from said filter, at which output a signal is obtained constituting a weighted sum of the input signal E subjected to successive delays in M+L cells each imparting a delay T.

Consider the following notation:

$C_k = Cp_k + jCq_k$ i.e. the complex coefficient of index k in the transversal filter. The transversal filter has a central coefficient $C_O$ such that $C_O = Cp_O + jCq_O$, M leading coefficients (from $-M$ to $-1$), and L trailing coefficients (from $+1$ to $+L$).

$Ze(t) = Xe(t) + jYe(t)$ is the emitted baseband signal (prior to filtering) at time.

$Sr(t) = (Xr(t) + jYr(t)).EXP(j\Omega_O t) = Zr(t).EXP(j\Omega_O t)$ is the signal present on reception at time corresponding to the coefficient $C_O$ of the transversal filter, with filtering being performed at intermediate frequency, as shown in FIG. 1, with $\Omega_O$ being the angular frequency of the intermediate frequency carrier. (In order to simplify writing down the equations, no account is taken herein of the time delay between transmission and reception, but that does not reduce the generality of the description.)

The signal at the output from the transversal filter can be written:

$$Sc(t) = \sum_{k=-M}^{+L} C_k \cdot Sr(t - kT) = Xc(t) + jYc(t)$$

where T is a fixed delay which is usually taken to be equal to the symbol time Ts, then $$Sc(t) = EXP(j\Omega_0 t) \cdot \sum_{k=-M}^{+L} C_k \cdot Zr(t - kT) \cdot EXP(-jk\Omega_0 T)$$

Let the quantity $$\sum_{k=-M}^{+L} C_k \cdot Zr(t - kT) \cdot EXP(-jk\Omega_0 T)$$

be written Zc(t) which constitutes the complex representation in baseband of the equalized received signal.

The coefficients $C_k$ for obtaining the best possible reception of the transmitted signal are calculated using an algorithm derived from the gradient algorithm for k varying from $-M$ to $+L$:

$$C_k^{i+1} = C_k^i - \mu.E_i.Ze_{i-k}^*.EXP(jk\Omega_O T)$$

for k varying from $-M$ to $+L$, where:

$C_k^i$ is the complex coefficient of index k taken at instant $t = iTs$;

$\mu$ is the algorithm step size (constant);

$E_i = Ep_i + j.Eq_i$ is the complex error signal at the instant $t = i.Ts$ (giving $Ei = Zc(t = i.T) - Ze(t = i.T)$); and $Ze_{i-k}^*$ is the complex conjugate of the emitted signal at instant $t = (i - k).Ts$ thus giving the regenerated signal as:

$$D_i = Xc(t = i.Ts) + j\overline{Yc}(t = i.Ts)$$

where the symbol $-$ represents the decision taken during regeneration. When equalization is correctly performed, the signal regenerated on reception at the characteristic instants is equal to the transmitted signal:

$$D_i = Ze(t = i.Ts)$$

It is common practice to modify the algorithm giving $C_k^{i+1}$ as follows $$C_k^{i+1} = C_k^i - \mu.\overline{E}_i.D_{i-k}^*.EXP(jk\Omega_O T)$$

where $\overline{E}_i = Zc(t = i.Ts) - D_i$ and then as follows:

$$C_k^{i+1} = C_k^i - \mu.sgn(\overline{E}_i).sgn(D_{i-k}^*.EXP(jk\Omega_O T))$$

where $sgn(a + j.b) = sgn(a) + j.sgn(b)$ for real a and b (where $sgn(a) = $ the sign of a).

It appears that the terms in $EXP(jk\Omega_O T)$ complicate practical implementation of the algorithm.

The equalizers currently used with microwave beams are synchronous equalizers for which $T = Ts$, where Ts represents the duration of one symbol.

A first way of simplifying $EXP(jk\Omega_O T)$ consists in ensuring that $\Omega_O T = \Omega_O Ts = N.2\pi$ where N is an arbitrary integer. An example of an implementation is described in the article entitled "6 GHz 135 MBPS digital radio system with 64 QAM modulation" by T. Noguchi, T. Ryu, Y. Koizumi, S. Mizoguchi, M. Yoshimoto, K. Nakamura published in ICC 1983, pp. 1472 to 1477, in which the framed data rate 6/Ts is adjusted to satisfy the equation $\Omega_O Ts = 6\pi$. That gives $EXP(jk\Omega_O T) = 1$ for all values of k, thereby simplifying the algorithm for $C_k^{i+1}$, giving:

$$C_k^{i+1} = C_k^i - \mu.sgn(\overline{E}_i).sgn(D_{i-k}^*)$$

A second way of simplifying $EXP(jk\Omega_O T)$ when $\Omega_O Ts = (N + \epsilon).2\pi$, where $\epsilon$ is about 1/100 or $-1/100$, consists in performing $\Omega_O T = N.2\pi$, i.e. in using a practical delay T which is very slightly different from Ts, in which case performance degradation is not very significant.

However, these solutions suffer from various drawbacks: in the first solution, $\Omega_O Ts$ can be adjusted only by using a framed data rate greater than the line data rate. Indeed, this increase in data rate is common practice in digital microwave beams for several reasons: to make it possible to use or add auxiliary channels, when using error correcting codes which increase data rate, etc. However, it is desirable that this increase in data rate should not have to satisfy the condition $\Omega_O Ts = N.2\pi$ which is very stringent, since in practical cases that gives only one possibility at best for Ts.

The second solution can be envisaged only in fairly specific cases: for example framed data rates close to 140 Mbit/s for 16 state quadrature amplitude modulation (QAM) or for 64 QAM or for 256 QAM, with intermediate frequencies of 70 MHz or 140 MHz, giving $N = 2, 3, 4, 6,$ or 8. In addition, performance is slightly degraded compared with the optimum.

The object of the present invention is to make it possible to have $\Omega_O$ and Ts which are independent from each other while making use of the simplicity of the last algorithm for obtaining $C_k^{i+1}$.

Figure 2:
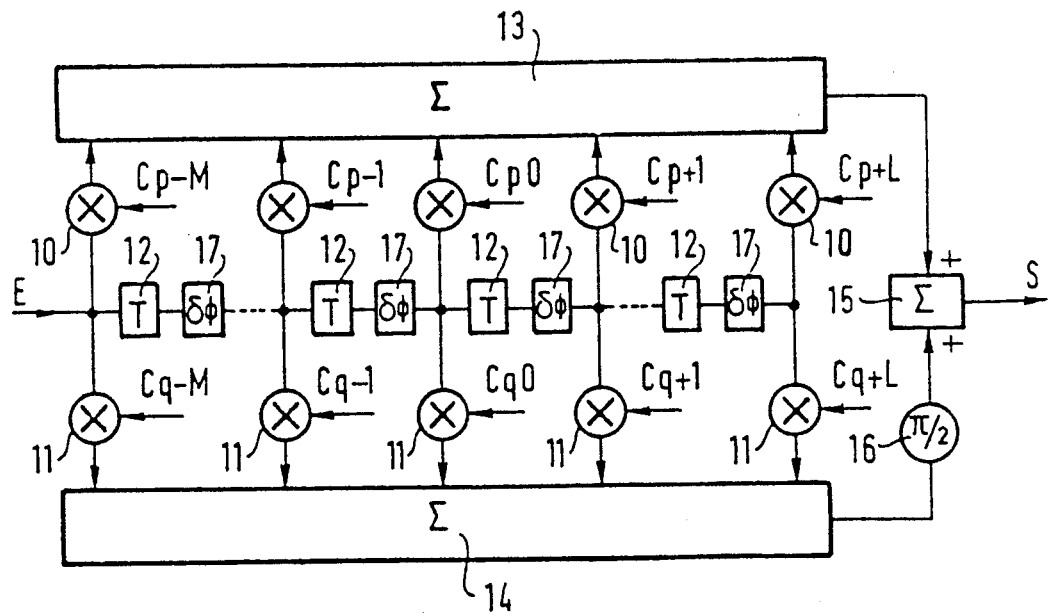
FIG. 2 shows a first embodiment of a transversal filter of the invention.

The invention consists in using wideband phase shifters 17 which compensate the terms in $EXP(-jk\Omega_oT)$ in the expression for $Sc(t)$; with each phase shifter 17 being connected in series with a delay cell 12, as shown in FIG. 2.

$\delta\phi$ is a wideband phase shifter such that $EXP(j\delta\phi)=EXP(j\Omega_oTs)$, i.e. such that $\delta\phi=\Omega_oTs(modulo\ 2\pi)$.

The baseband signal is then written:

$$Z_c(t) \sum_{k=-M}^{+L} C_k \cdot Z_r(t - kTs)$$

and the coefficient-controlling algorithm is written:

$$C_k^{i+1} = C_k^i - \mu.sgn(\bar{E}_i).sgn(D_{i-k}^*)$$

which is then easily implemented.

Figure 3:
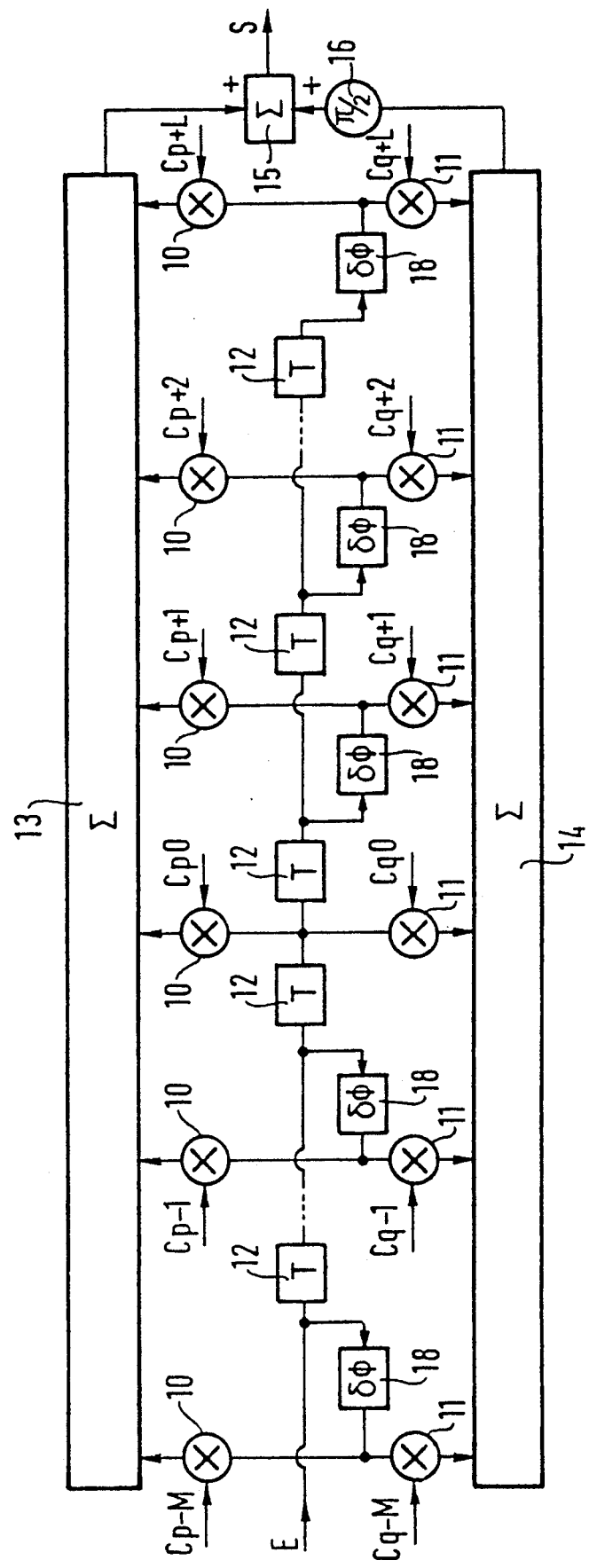
FIG. 3 shows a second embodiment of a transversal filter of the invention.

A second embodiment is shown in FIG. 3. The delay cells 12 are still connected in series, but they are connected to the midpoints of the various branches of index i via phase shifters 18 providing a shift of value $i\delta\phi$, with each phase shifter of value $i\delta\phi$ being connected to the branch of index i, where $-M \leq i \leq +L$.

Figure 4:
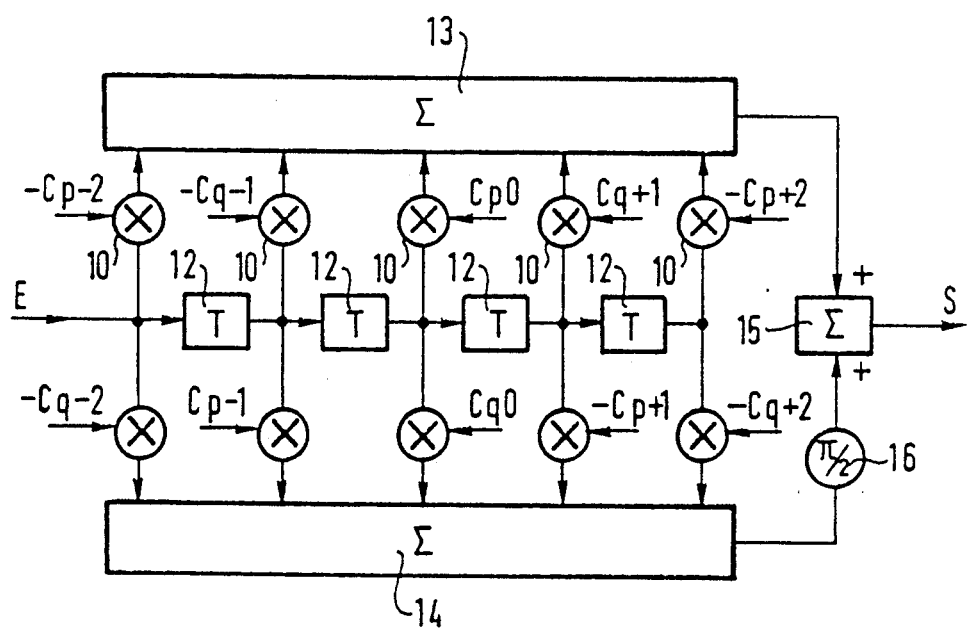
FIG. 4 shows a special case of the transversal filter shown in FIG. 3.

Although this implementation appears more complex, a priori, it has a major practical advantage when $\Omega_o.Ts = O(mod\ \pi/2)$, since it is then possible to use a $\pi/2$ phase shifter which is already included in the circuit. A practical example of such an embodiment is shown in FIG. 4 for an equalizer where $M=L=2$, and $\Omega_o.Ts = -\pi/2\ (mod\ 2\pi)$.

It can be seen that the in-phase coefficients (Cp) and the quadrature coefficients (Cq) can then either remain in their original branches (possibly with a change of sign), or else they may be moved to the branch which is in quadrature therewith (possibly with a change of sign). The phase shifters for shifting $\pi/2$, $-\pi/2$, $\pi$, etc. ... can thus be made in a manner which is particularly simple and attractive.

The filter is then such that the branch of index $-2$ has a first coefficient $-Cp_{-2}$ and a second coefficient $-Cq_{-2}$; the branch of index $-1$ has a first coefficient $-Cq_{-1}$ and a second coefficient $Cp_{-1}$; the branch of index $+1$ has a first coefficient $Cq_{+1}$ and a second coefficient $-Cp_{+1}$; and the branch of index $+2$ has a first coefficient $-Cp_{+2}$ and a second coefficient $-Cq_{+2}$.

It is important to note that this solution is also highly advantageous in practice when the value of $\Omega_o.Ts$ is close to $O(mod\ \pi/2)$.

Transversal filters include recursive filters which have one or more feedback loops and which therefore have an infinite impulse response, and non-recursive filters which have a finite impulse response, since they have no loops.

A transversal filter having a direct portion and a recursive portion is described at page 138 of the above-mentioned article by O. de Luca entitled "Self-adaptive baseband equalizers for digital microwave beams".

Figure 5:
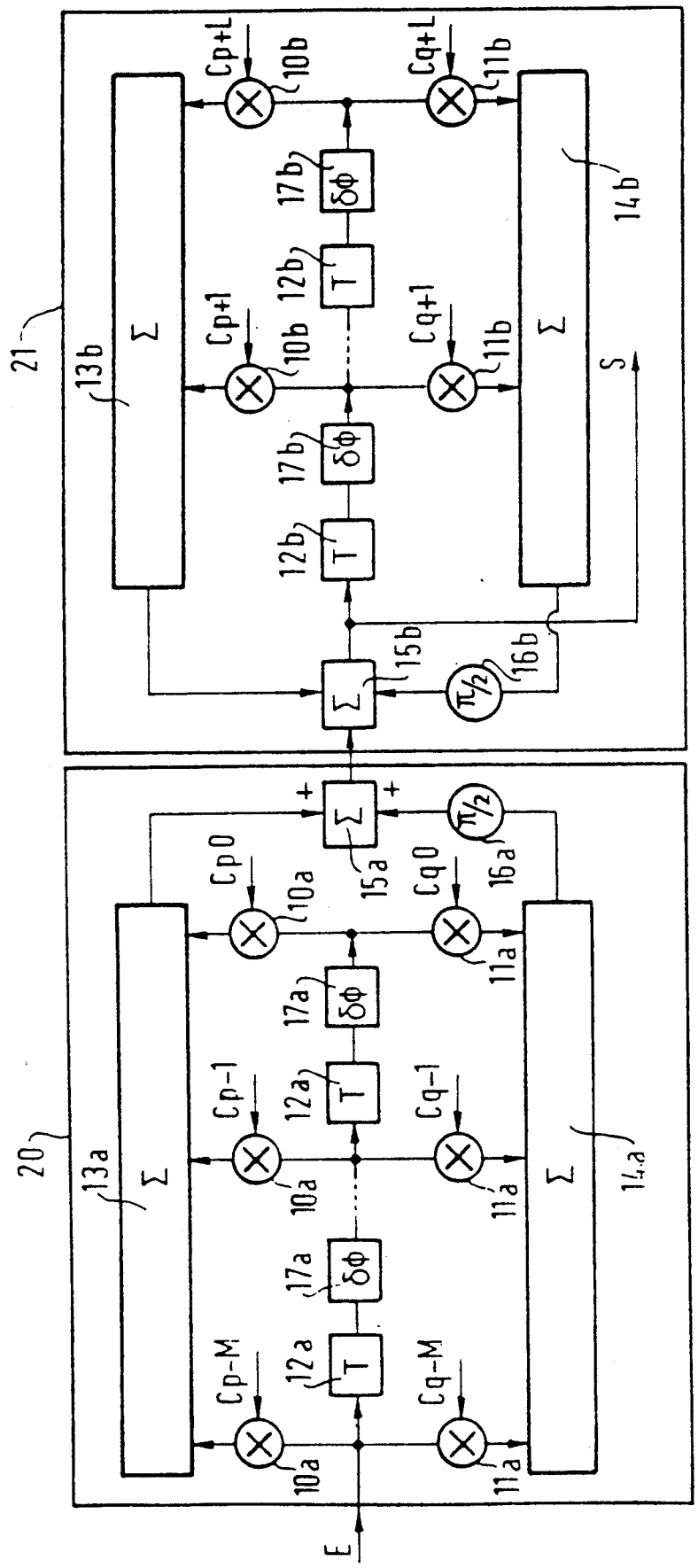
FIG. 5 shows another embodiment of a transversal filter of the invention.

Such a transversal filter may be implemented using the filter of the invention. Thus, FIG. 5 shows a filter with a leading transversal portion 20 and a trailing recursive portion 21. This filter uses the same elements as shown in FIG. 2, with the elements of the leading transversal portion having an index a, and those of the trailing recursive portion having an index b.

Thus, the recursive portion 21 has a direct portion whose signal is successively delayed in N cells 12b providing a delay T, each of which is associated with a phase shifter 17b. The weighted sum of these delayed signals is then looped back via an input summing circuit 15b.

Naturally, the invention has been described and shown purely by way of preferred example, and its component elements could be replaced by equivalent elements without thereby going beyond the scope of the invention.

Thus, the transverse filter of FIG. 5 having a direct portion and a recursive portion, could equally well be based on the filters shown in FIGS. 3 and 4.

I claim:

1. A transversal filter for filtering an input signal comprising an intermediate carrier having an in-phase portion and a quadrature portion, said filter comprising:
   a linear array of $M+L+1$ branches and comprising
      a central branch having an associated index $i=0$,
      L trailing branches each having a respective positive index i where $+1 \leq i \leq +L$, and
      M leading branches each having a respective negative index i where $-M \leq i \leq -1$;
   wherein each of said $M+L+1$ branches further comprises
      a branch midpoint which functions as a branch input terminal, with the input signal being directly input to the midpoint of the branch of index $-M$,
      a first multiplier for multiplying any branch input signal present at the branch midpoint by a first coefficient $Cp_i$ corresponding to said in-phase portion to provide a first branch output, and
      a second multiplier for multiplying the branch input signal by a second coefficient $Cq_i$ corresponding to said quadrature portion to thereby produce a second branch output;
   $M+L$ delay cells each providing a delay T;
   $M+L$ wideband phase shifters each connected in series with a respective one of said $M+L$ delay cells, the series connection of each phase shifter and its respective delay cell being coupled between the branch midpoint of a respective branch of index i and the branch midpoint of an immediately succeeding branch of index $i+1$ where $-M \leq i < L$, each said phase shifter providing a phase shift $\delta\phi$ such that $\delta\phi = \Omega_oT$ (modulo $2\pi$) where $\Omega_o$ is the angular frequency of the intermediate carrier;
   a first summing circuit for summing the outputs of the first multipliers to provide a first summing circuit output;
   a second summing circuit for summing the outputs of the second multipliers to provide a second summing circuit output;
   a $\pi/2$ phase shifter responsive to the output of the second summing circuit to provide a $\pi/2$ phase shifter output; and
   a third summing circuit for summing the output of the first summing circuit and the output of the $\pi/2$ phase shifter, said third summing circuit providing an output of the filter,
   whereby any intermediate carrier signal present at the branch midpoint of index i is subjected to a delay of i.T and a phase shift of $i.\delta\phi$ relative to a corresponding signal at the branch midpoint of index 0.

2. A filter according to claim 1, wherein said in-phase portion is modulated with a succession of data symbols and the delay T is equal to a time Ts corresponding to a period between the beginning of adjacent such data symbols.

3. A filter according to claim 1, wherein $\Omega_O T = -\pi/2$ (modulo $2\pi$).

4. A filter according to claim 1, wherein $\Omega_O T = \pi/2$ (modulo $2\pi$).

5. A transversal filter for filtering an input signal comprising an intermediate carrier having an in-phase portion and a quadrature portion, said filter comprising:
   a linear array of $M+L+1$ branches and comprising
      a central branch having an associated index $i=0$,
      at least two trailing branches each having a respective positive index i where $+1 \leq i \leq +L$, and
      at least two leading branches each having a respective negative index i where $-M \leq i \leq -1$;
   wherein each of said central, trailing and leading branches further comprises
      a branch midpoint which functions as a branch input terminal, with the input signal being directly input to the midpoint of the branch of index $-M$,
      a respective first multiplier for multiplying any branch input signal present at the respective branch midpoint by a respective first coefficient to provide a respective first branch output, and
      a respective second multiplier for multiplying the branch input signal by a respective second coefficient to thereby produce a respective second branch output,
      wherein each branch of index $i = \pm 2$ (modulo 4) has a first coefficient of $-Cp_i$ and a second coefficient $-Cq_i$; each branch of index $i = -1$ (modulo 4) has a first coefficient $-Cq_i$ and a second coefficient $Cp_i$; each branch of index $i = 0$ (modulo 4) has a first coefficient $Cp_i$ and a second coefficient $Cq_i$, and each branch of index $i = 1$ (modulo 4) has a first coefficient $Cq_i$ and a second coefficient $-Cp_i$, where $Cp_i$ is the real part of a complex filter coefficient of index i corresponding to said in-phase portion, and $Cq_i$ is the imaginary part of said complex coefficient corresponding to said quadrature portion;
   $M+L$ delay cells each providing a delay T where $\Omega_O T = -\pi/2$ (modulo $2\pi$) and $\Omega_O$ is the angular frequency of the intermediate carrier, a respective one of said $M+L$ delay cells being coupled between the branch midpoint of a respective said branch of index i and the branch midpoint of an immediately succeeding said branch of index $i+1$ where $-M \leq i < L$;
   a first summing circuit for summing the outputs from said first multipliers to provide a first summing circuit output;
   a second summing circuit for summing the outputs of the second multipliers to provide a second summing circuit output;
   a $\pi/2$ phase shifter responsive to the output of the second summing circuit to provide a $\pi/2$ phase shifter output; and
   a third summing circuit for summing the output from the first summing circuit and to the output from the $\pi/2$ phase shifter, said third summing circuit providing the output of the filter,
   whereby any intermediate carrier signal present at the branch midpoint of index i is subjected to a delay of i.T and an effective phase shift of $-i.\pi/2$ relative to a corresponding signal at the branch midpoint of index 0.

6. A transverse/recursive filter for filtering an input signal comprising an intermediate carrier having an in-phase portion and a quadrature portion, said filter comprising:
   a leading transversal linear array of $M+1$ branches, said leading transversal linear array further comprising a central branch having an associated index $i=0$, and
   M leading branches each having a respective negative index i where $-M \leq i \leq -1$;
   a trailing recursive linear array of L trailing branches each having a respective positive index i where $1 \leq i \leq L$;
   wherein said central branch, each of said M leading branches and each of said L trailing branches further comprises
      a respective branch midpoint, with the input signal being directly coupled to the midpoint of the branch of index $-M$,
      a respective first multiplier for multiplying a signal present at the respective branch midpoint by a respective first coefficient $Cp_i$ corresponding to said in-phase signal portion, and
      a respective second multiplier for multiplying a signal present at the respective branch midpoint by a respective second coefficient $Cq_i$ corresponding to said quadrature signal portion;
   a first summing circuit responsive to the outputs of the first multipliers of the transverse filter linear array to provide a first summing circuit output;
   a second summing circuit responsive to the outputs of the second multipliers of the transverse filter linear array to provide a second summing circuit output;
   a first $\pi/2$ phase shifter responsive to the output of the second summing circuit to provide a first $\pi/2$ phase shifter output;
   a third summing circuit responsive to the outputs of the first multipliers of the recursive filter linear array to provide a third summing circuit output;
   a fourth summing circuit responsive to the outputs of the second multipliers of the recursive filter linear array to provide a fourth summing circuit output;
   a second $\pi/2$ phase shifter responsive to the output of the fourth summing circuit to provide a second $\pi/2$ phase shifter output, and
   summing means responsive to the outputs from the first and third summing circuits and from the first and second $\pi/2$ phase shifters for providing an output of the transverse/recursive filter;
   $M+L$ delay cells each providing a delay T;
   $M+L$ wideband phase shifters each being connected in series with a respective one of said $M+L$ delay cells to provide $M+L$ series connections, one of said series connections being coupled between said summing means and the branch midpoint of index $+1$, each of the remaining series connections being coupled between a branch midpoint of index i ($i \neq 0$) and an immediately succeeding branch midpoint of index $i+1$, each said phase shifter providing a phase shift $\delta\phi$ such that $\delta\phi \Omega_O T$ (modulo $2\pi$) where $\Omega_O$ is the angular frequency of the intermediate carrier,
   whereby any intermediate carrier signal present at the branch midpoint of index i is subjected to a delay of i.T and a phase shift of $i.\delta\phi$ relative to a corresponding signal at the branch midpoint of index O.

7. A transversal filter for filtering an input signal comprising an intermediate carrier having an in-phase portion and a quadrature portion, said filter comprising:
a linear array of $M+L+1$ branches and comprising
a central branch having an associated index $i=0$,
L trailing branches each having a respective positive index i where $+1 \leq i \leq +L$, and
M leading branches each having a respective negative index i where $-M \leq i \leq -1$;
wherein each of said $M+L+1$ branches further comprises
a branch midpoint, the midpoint of the central branch functioning as a branch input of index 0,
a first multiplier for multiplying any branch input signal present at the branch midpoint by a respective first coefficient $Cp_i$ corresponding to the in-phase signal portion to provide a first branch output, and
a second multiplier for multiplying the branch input signal by a respective second coefficient $Cq_i$ corresponding to the quadrature signal portion to thereby produce a second branch output;
$M+L$ wideband phase shifters, each associated with a respective one of said leading and trailing branches and having a respective output directly coupled to the respective branch midpoint, as well as a respective input which functions as a respective branch input of index i, each said wideband phase shifter providing a respective phase shift $i.\delta\phi$ such that $\delta\phi = \Omega_O T$ (moldulo $2\pi$) where $\Omega_O$ is the angular frequency of the intermediate carrier, i is the index of the respective associated branch, and T is a predetermined period;
$M+L$ cells each providing a delay equal to said predetermined period T and being directly connected between the respective branch input of a respective said branch of index i and the branch midpoint of an immediately succeeding said branch of index $i+1$ where $-M \leq i < L$;
a first summing circuit for summing the outputs from said first multipliers to provide a first summing circuit output;
a second summing circuit for summing the outputs of the second multipliers to provide a second summing circuit output;
a $\pi/2$ phase shifter responsive to the output of the second summing circuit to provide a $\pi/2$ phase shifter output; and
a third summing circuit for summing the output from the first summing circuit and to the output from the $\pi/2$ phase shifter, said third summing circuit providing the output of the filter,
whereby any signal present at the branch midpoint of index i is subjected to a delay of i.T and a phase shift of $i.\delta\phi$ relative to a corresponding signal at the branch midpoint of index 0.

* * * * *